United States Patent [19]
Lau et al.

[11] Patent Number: 6,133,793
[45] Date of Patent: Oct. 17, 2000

[54] CIRCUIT AND METHOD OF AMPLIFYING A SIGNAL FOR A RECEIVER

[75] Inventors: Sin Kai Henry Lau, Scottsdale; Timothy Ernest Seneff, Chandler, both of Ariz.

[73] Assignee: Motorola, Inc., Schaumburg, Ill.

[21] Appl. No.: 09/122,730

[22] Filed: Jul. 27, 1998

[51] Int. Cl.[7] .................................................. H03F 3/191
[52] U.S. Cl. .......................................... 330/302; 330/310
[58] Field of Search .................................... 330/301, 302, 330/306, 310, 311; 327/356, 359

[56] References Cited

U.S. PATENT DOCUMENTS

| | | | |
|---|---|---|---|
| 4,893,035 | 1/1990 | Reynolds et al. | 330/306 X |
| 5,339,048 | 8/1994 | Weber | 330/302 |
| 5,825,231 | 10/1998 | Chevallier et al. | 327/359 X |
| 5,945,878 | 8/1999 | Westwick et al. | 330/301 |
| 5,945,879 | 8/1999 | Rodwell et al. | 330/310 |

*Primary Examiner*—Steven J. Mottola
*Attorney, Agent, or Firm*—Lanny L. Parker

[57] ABSTRACT

A transceiver (10) has a transmitter (12) and an image reject receiver (16). The image reject receiver (16) provides frequency translation of two modulated signals received from an antenna (14). The image reject receiver (16) has two mixers (22 and 32) to accomplish the frequency translation. One mixer (22) receives a modulated signal for GSM operation and the other mixer (32) receives a modulated signal for DCS/PCS operation. A local oscillator (24) generates another signal having a gain controlled by an amplifier (26) for supplying differential signals to both of the mixers (22 and 32). The amplifier (26) uses transistors (46 and 58) with inductors (40, 52, and 68) to generate the differential signals.

8 Claims, 1 Drawing Sheet

CIRCUIT AND METHOD OF AMPLIFYING A SIGNAL FOR A RECEIVER

BACKGROUND OF THE INVENTION

The present invention relates, in general, to integrated circuits and, more particularly, to integrated mixer circuits for providing frequency translation in a heterodyne receiver.

In electronic systems such as cellular or wireless telephones, a signal generated by a Local Oscillator (LO) is selected to operate at a frequency that allows tuning of an incoming signal. The incoming signal can be a modulated signal containing information that is recovered in a receiver of the electronic system. The modulated signal and the signal generated by the LO are mixed to translate the carrier frequency of the modulated signal from the Radio Frequency (RF) range to a signal having frequencies in an Intermediate Frequency (IF) range.

Generally, the signal generated by the LO has a large amplitude compared to the amplitude of the received modulated signal. The amplitude of the signals received by the receiver are adjusted by amplifiers. In addition, some receivers such as a heterodyne receiver, include passive filters that reject unwanted images. Any inaccuracies in amplitude and phase shifting generate an undesired component during translation of the modulated signal. Thus, accurate amplitude and phase shifting are necessary for preventing an undesired image signal and allowing the information in the modulated signal to be recovered and the image signals to be canceled.

However, it is difficult to maintain equivalent signal attenuation through the mixers as well as linearity in the phase shifters capable of generating a phase relationship of one hundred and eighty degrees. Voltage and temperature changes in a heterodyne receiver cause signal distortions in phase shifters operating over a wide frequency range.

Accordingly, it would be advantageous to have a method and a receiver circuit for translating the frequency of an incoming modulated signal. It would be of further advantage to have the receiver circuit operate with an LO signal that is converted to differential signals having an accurate phase relationship over a wide range of operation.

DETAILED DESCRIPTION OF THE DRAWINGS

Generally, the present invention provides frequency translation of two modulated signals in the front end of a receiver system. The receiver system includes two mixer circuits to accomplish the frequency translation. One mixer circuit receives a modulated signal for use in Global System for Mobil communications (GSM) and the other mixer circuit receives a modulated signal for digital communications services/personal communications services (DCS/PCS) operation. A Local Oscillator (LO) generates another signal that is amplified by a gain controlled amplifier. The amplified signal is transferred to both mixer circuits. The modulated signals are mixed with the amplified signal to translate the carrier frequency of the modulated signals from the Radio Frequency (RF) range to the Intermediate Frequency (IF) range. After frequency translation, the modulated signals contain information that is recovered in the receiver.

Figure 1:
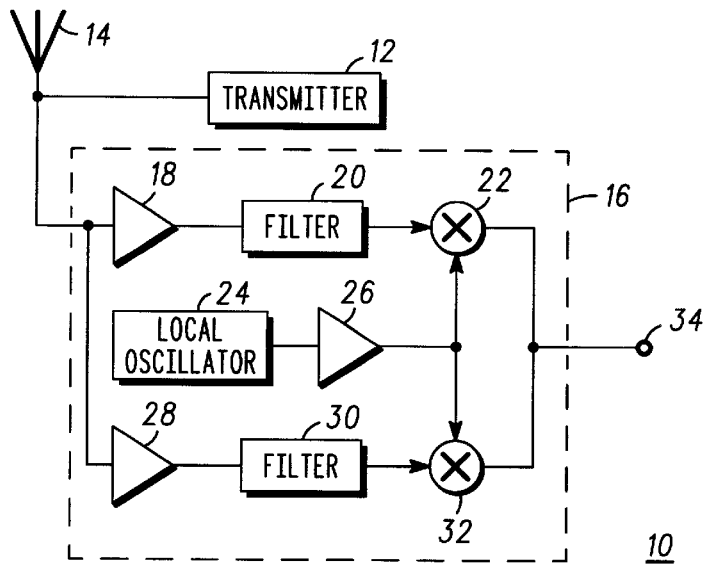
FIG. 1 is a block diagram of a transceiver having a trasmitter and an image reject receiver in accordance with the present invention.

FIG. 1 is a block diagram of a transceiver 10 having a transmitter 12 and a receiver 16 in accordance with the present invention. Transmitter 12 receives an input signal that is transmitted from an antenna 14. Transceiver 10 includes a heterodyne receiver 16 capable of receiving multiple bandwidth signals. A first signal path in heterodyne receiver 16 is comprised of an amplifier 18, a filter 20, and a mixer 22. This first signal path is selected in accordance with a band activation signal (not shown) to receive a modulated signal having a frequency of, for example, 900 megahertz (MHz). Amplifier 18 has an input connected to antenna 14 for receiving the 900 MHz modulated signal. An output of amplifier 18 is coupled to a first input of mixer 22 via filter 20. A second input of mixer 22 is coupled to a local oscillator 24 via an amplifier 26. By way of example, local oscillator 24 generates a signal having a frequency ranging from about 1.3 gigahertz (GHz) to about 1.6 GHz. An output of mixer 22 is connected to output terminal 34 of heterodyne receiver 16.

A second signal path in heterodyne receiver 16 is comprised of an amplifier 28, a filter 30, and a mixer 32. This second signal path is selected in accordance with a band activation signal (not shown) to receive a modulated signal having a frequency of, for example, 1800 MHz/1900 MHz. Amplifier 28 has an input connected to antenna 14 for receiving the 1800 MHz/1900 MHz modulated signal. An output of amplifier 28 is coupled to a first input of mixer 32 via filter 30. A second input of mixer 32 is connected to an output of amplifier 26 for receiving the signal generated by local oscillator 24. An output of mixer 32 is connected to output terminal 34 of heterodyne receiver 16.

Although mixers 22 and 32, and amplifier 26 have been illustrated in FIG. 1 as having single-ended inputs and outputs for simplicity, the input and output signals of mixers 22 and 32 may be differential signals. Thus, heterodyne receiver 16 of the present invention is not limited to operating with single-ended signals.

Figure 2:
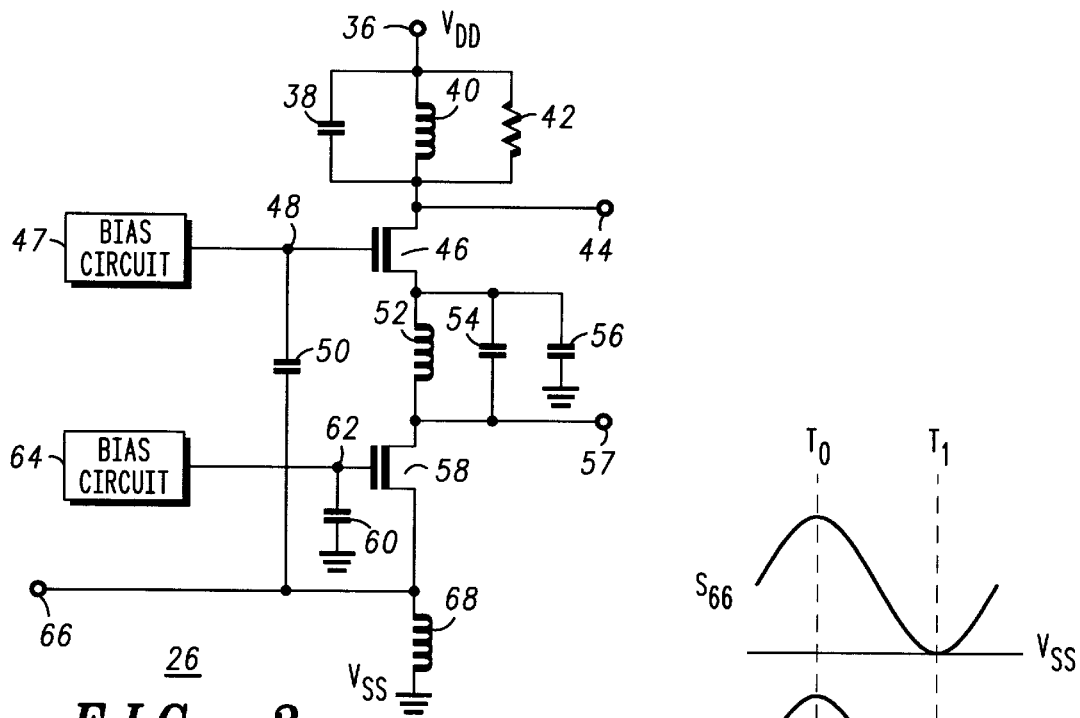
FIG. 2 is a schematic diagram of an amplifier used in the image reject receiver of FIG. 1.

FIG. 2 is a schematic diagram of amplifier 26 used in heterodyne receiver 16 of FIG. 1. It should be noted that the same reference numbers are used in the figures to denote the same elements. Amplifier 26 has an input terminal 66 coupled for receiving the signal generated by local oscillator 24 (FIG. 1) and output terminals 44 and 57 that supply differential output signals to both mixers 22 and 32. Amplifier 26 includes transistors 46 and 58 that are illustrated in FIG. 2 as N-channel Field Effect Transistors (FETs) having a gate terminal, a drain terminal, and a source terminal. Transistors 46 and 58 could be either N-channel or P-channel FETs, N-channel or P-channel Graded Channel Metal Oxide Semiconductor (GCMOS) transistors, or the like. Alternatively, transistors 46 and 58 could be NPN or PNP bipolar transistors.

An output terminal of a bias circuit 47 is connected to the gate terminal of transistor 46. Bias circuit 47 generates a reference voltage at node 48 for transistor 46. The operating voltage VDD ranges from about 2 volts to about 5 volts and has a typical value of about 2.75 volts. The reference voltage is selected to be above the threshold voltage of transistor 46, causing the transistor to conduct current. Likewise, an output terminal of a bias circuit 64 is connected to the gate terminal of transistor 58. Bias circuit 64 generates a reference voltage at node 62 for transistor 58. The reference voltage is above the threshold voltage of transistor 46 causing the transistor to conduct current. A capacitor 60 having a value of, for example, about 20 picofarads (pf) is coupled between node 62 and the ground reference.

In one configuration, bias circuits 47 and 64 could each be a resistor divider network (not shown) formed by a pair of resistors that are serially connected and coupled between the operating voltage and the ground reference. The reference voltage for biasing transistors 46 and 58 is generated at the commonly connected terminals of the resistors in the resistor divider network (not shown). In another configuration, the reference voltage supplied by bias circuits 47 and 64 could be generated using either FET transistors or bipolar transistors (not shown) arranged in a current mirror configuration. By way of example, the reference voltage generated by bias circuit 64 is about 0.8 volt and the reference voltage generated by bias circuit 47 is about 2 volts. The method used in bias circuits 47 and 64 for generating the reference voltages that bias respective transistors 46 and 58 into their conduction regions is not a limitation of the present invention.

A capacitor 38, an inductor 40, and a resistor 42 form a tank circuit. First terminals of capacitor 38, inductor 40, and resistor 42 are commonly connected to each other and to terminal 36 for receiving the operating voltage $V_{DD}$. Second terminals of capacitor 38, inductor 40, and resistor 42 are commonly connected to each other, to the drain terminal of transistor 46, and to output terminal 44 of amplifier 26. By way of example, capacitor 38 has a value of about 1.6 pf, inductor 40 has a value of about 5 nanohenries (nH), and resistor 42 has a value of about 600 ohms.

An inductor 52 is connected in parallel with a capacitor 54. The parallel combination of inductor 52 and capacitor 54 couples a source terminal of transistor 46 to a drain terminal of transistor 58. A capacitor 56 couples the source terminal of transistor 46 to the ground reference. The drain terminal of transistor 58 is connected to output terminal 57 of amplifier 26. A source terminal of transistor 58 is connected to input terminal 66, coupled to node 48 by a capacitor 50, and coupled to the ground reference $V_{ss}$ by an inductor 68. By way of example, inductor 52 has a value of about 5 nH, capacitor 54 has a value of about 2 pf, capacitor 56 has a value of about 20 pf, capacitor 50 has a value of about 5 pf, and inductor 68 has a value of about 22 nH.

Figure 3:
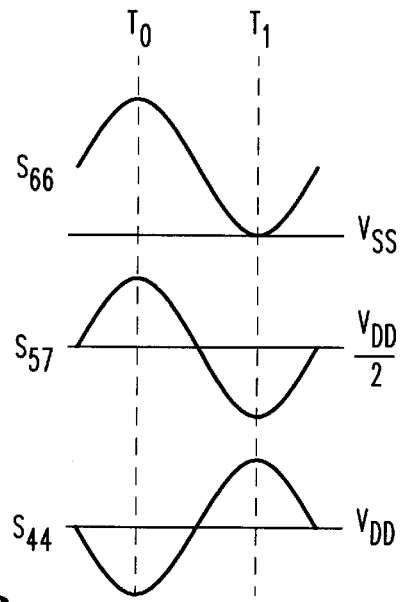
FIG. 3 illustrates signal waveforms for the amplifier of FIG. 2.

FIG. 3 illustrates signal waveforms for amplifier 26 of FIG. 2. Signal $S_{66}$ is supplied at input terminal 66 of amplifier 26, signal $S_{57}$ is generated at output terminal 57, and signal $S_{44}$ is generated at output terminal 44. The vertical axes for signals $S_{44}$, $S_{57}$, $S_{66}$ represent voltage and the horizontal axes represent time. In particular, the waveforms show that signal $S_{57}$ is generated in phase with the signal $S_{66}$ as indicated by both signals having a high peak voltage at time $T_0$ and a low peak voltage at time $T_1$. On the other hand, the signal $S_{44}$ is out of phase to the input signal $S_{66}$. In other words, signal $S_{66}$ has a high peak voltage at time $T_0$ while signal $S_{44}$ has a low peak voltage. Thus, the generated signals $S_{44}$ and $S_{57}$ are differential signals having a phase separation of one hundred and eighty degrees with respect to each other. It should be noted that the amplitudes of signals $S_{44}$, $S_{57}$, $S_{66}$ are not drawn to scale.

In operation, local oscillator 24 (FIG. 1) generates signal $S_{66}$ having a voltage value between the value of the operating voltage $V_{DD}$ and the ground reference $V_{ss}$. With signal $S_{66}$ as the input of amplifier 26, a high voltage value of signal $S_{66}$ at time $T_0$ (FIG. 2 and 3) causes transistor 58 to conduct less current. The increasing voltage of signal $S_{66}$ prior to time $T_0$ is coupled across bypass capacitor 50 which causes transistor 46 to conduct more current. It should be noted that the voltage at the source of transistor 46 is about $V_{DD}/2$ and held at that voltage by stabilizing capacitor 56.

With transistor 58 conducting less current, the signal $S_{57}$ at time $T_0$ increases in voltage. Signal $S_{57}$ has a voltage value that is centered about the midpoint of the operating voltage, i.e., a voltage value of about $V_{DD}/2$, and changes from that midpoint value by several hundred millivolts. Thus, at time $T_0$ the signal $S_{57}$ has a value that is about 300 millivolts above the voltage value of about $V_{DD}/2$. On the other hand, with transistor 46 conducting more current, a larger voltage is dropped across resistor 42 causing the voltage of signal $S_{44}$ at time $T_0$ to decrease. Signal $S_{44}$ has a voltage value that is centered about the operating voltage $V_{DD}$ and changes from that voltage value by several hundred millivolts. Thus, at time $T_0$ the signal $S_{44}$ has a value that is about 300 millivolts below the value of the operating voltage $V_{DD}$.

At time $T_1$ the low voltage value of signal $S_{66}$ causes transistor 58 to conduct more current. The decreasing voltage of signal $S_{66}$ prior to time $T_1$ is coupled across bypass capacitor 50 which causes transistor 46 to conduct less current. With transistor 58 conducting more current, the signal $S_{57}$ prior to time $T_1$ decreases in voltage. Thus, at time $T_1$ the signal $S_{57}$ has a value that is about 300 millivolts lower than the midpoint voltage value of about $V_{DD}/2$. On the other hand, with transistor 46 conducting less current a lower voltage is dropped across resistor 42 causing the voltage of signal $S_{44}$ at time $T_1$ to increase. Thus, at time $T_1$ the signal $S_{44}$ has a value that is about 300 millivolts above the value of the operating voltage $V_{DD}$. Typically, signals $S_{44}$ and $S_{57}$ have peak-to-peak voltages of about 1200 millivolts.

Amplifier 26 receives a single-ended signal and generates differential output signals. The differential output signals have a higher peak-to-peak voltage compared to the outputs generated by prior art amplifiers. The present invention uses inductive loads instead of resistive loads. The inductive loads, i.e., inductors 40, 52, and 68, do not cause voltage drops and therefore allow amplifier 26 to operate at a lower operating voltage $V_{DD}$. The lower operating voltage is desired for use in wireless portable communication applications. Further, the inductive loads tune out the parasitic capacitance associated with the source and drain diffusions of transistors 46 and 58 and the capacitance associated with the inputs of mixers 22 and 32, allowing amplifier 26 to have a higher gain at the higher operating frequencies. In addition, with inductors 40, 52, and 68 arranged to tune out the parasitic capacitance of transistors 46 and 58, these transistors can be processed having larger width geometries which also increases the gain of amplifier 26. It should be noted that the value of resistor 42 is selected to balance the output amplitudes of transistors 46 and 58.

Image reject receiver 16 (FIG. 1) includes a bandpass filter 20 that supplies a 900 MHz modulated signal to mixer 22. Mixer 22 receives the modulated signal and the differential signals from amplifier 26 and provides frequency translation. When selected, the 1800 MHz/1900 MHz modulated signal received by antenna 14 is filtered by bandpass filter 30 and mixed in mixer 32 with the differential signals from amplifier 26. The frequency translated signals generated by mixer 22 or by mixer 32 are selected and passed to output terminal 34 of heterodyne receiver 16.

By now it should be appreciated that a single-ended signal from local oscillator 24 is converted to differential output signals by amplifier 26. The correct phase relationship and the amplitude of the differential signals are important for providing frequency translation of the received signal while rejecting undesired images.

What is claimed is:

1. A receiver, comprising:

a local oscillator for supplying a signal;

an amplifier coupled for receiving the signal and supplying first and second differential output signals, wherein the amplifier includes, a first transistor having a control terminal coupled for receiving a first reference voltage and a first current carrying terminal coupled for receiving the signal;

a first inductor having a first terminal coupled to a second current carrying terminal of the first transistor for supplying the first differential output signal;

a second transistor having a control terminal coupled for receiving a second reference voltage, a first current carrying terminal coupled to a second terminal of the first inductor, and a second current carrying terminal coupled for supplying the second differential output signal a capacitor having a first terminal coupled to the first current carrying terminal of the first transistor and a second terminal coupled to the control terminal of the second transistor; and first and second mixers each having a first input for receiving a modulated signal and a second input coupled for receiving the first and second differential output signals generated by the amplifier.

2. The receiver of claim 1, further comprising a first filter having an input coupled for receiving the modulated signal and an output coupled to the first input of the first mixer.

3. The receiver of claim 1, further comprising a second filter having an input coupled for receiving the modulated signal and an output coupled to the first input of the second mixer.

4. An amplifier, comprising:

a first inductor having a first terminal coupled to a first power conductor for receiving a first operating voltage;

a first transistor having a control terminal coupled for receiving a first reference voltage and a first current carrying terminal coupled to a second terminal of the first inductor;

a second inductor having a first terminal coupled to a second current carrying terminal of the first transistor;

a second transistor having a control terminal coupled for receiving a second reference voltage, a first current carrying terminal coupled to a second terminal of the second inductor; and a third inductor having a first terminal coupled to a second current carrying terminal of the second transistor and to a terminal for receiving an input signal, and a second terminal coupled to a second power conductor for receiving a second operating voltage.

5. The amplifier of claim 4, further comprising a first capacitor having a first terminal coupled to the second current carrying terminal of the second transistor and a second terminal coupled to the control terminal of the first transistor.

6. The amplifier of claim 4, further comprising a resistor having a first terminal coupled to the first current carrying terminal of the first transistor and a second terminal coupled to the first power supply conductor.

7. The amplifier of claim 4, further comprising a second capacitor having a first terminal coupled to the second current carrying terminal of the first transistor and a second terminal coupled to the first current carrying terminal of the second transistor.

8. The amplifier of claim 5, further comprising a third capacitor that is connected in parallel with the resistor.

* * * * *